(12) United States Patent
Inoue

(10) Patent No.: US 9,252,682 B2
(45) Date of Patent: Feb. 2, 2016

(54) GRID-CONNECTED INVERTER APPARATUS AND CONTROL METHOD THEREFOR

(75) Inventor: Hirokazu Inoue, Yamoto (JP)

(73) Assignee: KYOCERA Corporation, Kyoto (JP)

(*) Notice: Subject to any disclaimer, the term of this patent is extended or adjusted under 35 U.S.C. 154(b) by 241 days.

(21) Appl. No.: 14/129,882

(22) PCT Filed: Jun. 28, 2012

(86) PCT No.: PCT/JP2012/004195
§ 371 (c)(1),
(2), (4) Date: Dec. 27, 2013

(87) PCT Pub. No.: WO2013/001820
PCT Pub. Date: Jan. 3, 2013

(65) Prior Publication Data
US 2014/0126259 A1 May 8, 2014

(30) Foreign Application Priority Data

Jun. 28, 2011 (JP) ................... 2011-142535

(51) Int. Cl.
*H02M 7/5387* (2007.01)
*H02M 1/32* (2007.01)
(Continued)

(52) U.S. Cl.
CPC ............ *H02M 7/5387* (2013.01); *H02J 3/381* (2013.01); *H02M 1/32* (2013.01); *H02M 7/48* (2013.01)

(58) Field of Classification Search
CPC ........... H02M 1/12; H02M 1/14; H02M 1/15; H02M 1/32; H02M 7/48; H02M 7/49; H02M 7/5387; H02M 7/66; H02M 2001/0048; H02M 2007/4835

USPC ................... 361/18, 86, 139, 160, 166, 187; 324/416, 418, 422, 424, 511, 522, 537; 340/638, 639, 644
See application file for complete search history.

(56) References Cited

U.S. PATENT DOCUMENTS 4,320,434 A * 3/1982 Stirk .................. H03K 17/0826
361/86
5,430,636 A * 7/1995 Kachi ..................... H02M 7/48
363/55
(Continued)

FOREIGN PATENT DOCUMENTS

JP 08-308247 A 11/1996
JP 2002-027764 A 1/2002
(Continued)

OTHER PUBLICATIONS

International Search Report; PCT/JP2012/004195; Oct. 2, 2012.

*Primary Examiner* — Timothy J Dole
*Assistant Examiner* — Yusef Ahmed
(74) *Attorney, Agent, or Firm* — Procopio, Cory, Hargreaves & Savitch LLP

(57) ABSTRACT

A grid-connected inverter apparatus includes: an inverter 50 for converting a DC output based on power generated from a power generation equipment 100 into an AC; a DC voltage measuring unit 40 for measuring a DC voltage on a DC input side of the inverter 50; a grid interconnection switch 70 having two independent relay switches 71, 72 each corresponding to phases of a grid power system 110 to which the inverter 50 is connected; and a control unit 90 for controlling the two relay switches 71, 72, such that the control unit 90, after opening the two relay switches 71, 72, changes the relay switch 71 such that the opening control is changes to closing control and, based on a change in the DC voltage measured by the DC voltage measuring unit 40 before and after the changing control, determines whether the relay switch 72 is faulty.

10 Claims, 5 Drawing Sheets

(51) Int. Cl.
*H02M 7/48* (2007.01)
*H02J 3/38* (2006.01)

(56) References Cited

U.S. PATENT DOCUMENTS

| | | | | |
|---|---|---|---|---|
| 5,574,320 A * | 11/1996 | Shirai | ............ | H01H 47/002 |
| | | | | 307/102 |
| 5,625,539 A * | 4/1997 | Nakata | ............ | H02M 7/4807 |
| | | | | 363/132 |
| 5,627,737 A * | 5/1997 | Maekawa | ............ | H02J 3/06 |
| | | | | 307/73 |
| 5,719,758 A * | 2/1998 | Nakata | ............ | G06F 1/67 |
| | | | | 323/906 |
| 6,198,612 B1 * | 3/2001 | Manner | ............ | G01R 31/025 |
| | | | | 324/527 |
| 7,251,741 B2 * | 7/2007 | Kobayashi | ............ | H02M 7/4807 |
| | | | | 713/300 |
| 7,253,639 B2 * | 8/2007 | Horikoshi | ............ | G01R 31/343 |
| | | | | 324/551 |
| 7,348,690 B2 * | 3/2008 | Muldoon | ............ | H02H 7/0844 |
| | | | | 307/140 |
| 8,049,455 B2 * | 11/2011 | Kitanaka | ............ | B60L 3/003 |
| | | | | 318/563 |
| 2001/0048605 A1 * | 12/2001 | Kurokami | ............ | H02J 7/0052 |
| | | | | 363/56.03 |
| 2002/0118559 A1 * | 8/2002 | Kurokami | ............ | H02M 1/15 |
| | | | | 363/131 |
| 2003/0067723 A1 * | 4/2003 | Suzui | ............ | H02H 7/1222 |
| | | | | 361/42 |
| 2005/0213272 A1 * | 9/2005 | Kobayashi | ............ | H02M 7/493 |
| | | | | 361/62 |
| 2005/0265087 A1 * | 12/2005 | Hourai | ............ | G01R 31/40 |
| | | | | 365/189.11 |
| 2006/0007627 A1 * | 1/2006 | Lewis | ............ | H03K 17/6874 |
| | | | | 361/160 |
| 2006/0156096 A1 * | 7/2006 | Sato | ............ | B60L 11/12 |
| | | | | 714/724 |
| 2007/0171689 A1 * | 7/2007 | Ishikawa | ............ | B60L 11/123 |
| | | | | 363/71 |
| 2009/0121549 A1 * | 5/2009 | Leonard | ............ | H02M 3/156 |
| | | | | 307/51 |
| 2009/0128347 A1 * | 5/2009 | Bucella | ............ | H02H 11/006 |
| | | | | 340/654 |
| 2009/0251831 A1 * | 10/2009 | Shiba | ............ | B60L 3/003 |
| | | | | 361/30 |
| 2011/0012424 A1 * | 1/2011 | Wortberg | ............ | H02J 7/1423 |
| | | | | 307/10.1 |
| 2011/0249475 A1 * | 10/2011 | Fujii | ............ | H02H 7/122 |
| | | | | 363/50 |
| 2012/0065845 A1 * | 3/2012 | Satake | ............ | B60N 2/002 |
| | | | | 701/47 |
| 2012/0161681 A1 * | 6/2012 | Kuroda | ............ | B62D 5/0481 |
| | | | | 318/400.21 |
| 2012/0243139 A1 * | 9/2012 | Jones | ............ | H01H 47/005 |
| | | | | 361/66 |
| 2014/0055059 A1 * | 2/2014 | Uryu | ............ | H02P 27/06 |
| | | | | 318/9 |
| 2014/0132073 A1 * | 5/2014 | Satake | ............ | H02J 1/102 |
| | | | | 307/64 |
| 2014/0152101 A1 * | 6/2014 | Kusunose | ............ | H02J 3/006 |
| | | | | 307/23 |
| 2014/0321019 A1 * | 10/2014 | Volke | ............ | H02M 7/49 |
| | | | | 361/91.1 |
| 2015/0008850 A1 * | 1/2015 | Zhao | ............ | B60L 11/1851 |
| | | | | 318/139 |

FOREIGN PATENT DOCUMENTS

| | | |
|---|---|---|
| JP | 2002-252986 A | 9/2002 |
| JP | 2004-014242 A | 1/2004 |
| JP | 2004-187362 A | 7/2004 |
| JP | 2007-174792 A | 7/2007 |
| JP | 2011-223764 A | 11/2011 |

* cited by examiner

GRID-CONNECTED INVERTER APPARATUS AND CONTROL METHOD THEREFOR

CROSS REFERENCE TO RELATED APPLICATION

This application claims priority to and the benefit of Japanese Patent Application No. 2011-142535 (filed on Jun. 28, 2011), the entire contents of which are incorporated herein by reference.

FIELD

The present invention relates to a grid-connected inverter apparatus for interconnecting a power generation equipment and a grid power system (grid) and also to a method of controlling the grid-connected inverter apparatus.

BACKGROUND

A power generation system having a power generation equipment such as a solar panel and the like is provided with a grid-connected inverter apparatus that converts a direct current (DC) from the power generation equipment into an alternating current (AC) and supplies power to loads on a premise by interconnecting with the grid or conducts reverse power flow of excess power to the grid. Such a grid-connected inverter apparatus is also called as a power conditioner and provided with an inverter for converting the DC from the power generation equipment into the AC and a grid interconnection switch for connecting the inverter to the grid (for example, see Patent Document 1).

The grid interconnection switch is usually constituted by using a relay switch and, upon occurrence of abnormalities of a grid voltage due to a power failure and the like, upon occurrence of a fault in the grid-connected inverter apparatus itself, or upon stopping operation of a driving operation by a user, switched off by a control unit. Thereby, the inverter is disconnected from the grid, such that the safety of the power generation system and the grid is ensured.

Patent Document 1: Japanese Unexamined Patent Application Publication No. 2002-27764

SUMMARY

Incidentally, since the grid-connected inverter apparatus operates an AC load, a relatively large current flows into the grid interconnection switch. Accordingly, it is anticipated that, when opening or closing the grid interconnection switch, arc discharge is likely to occur between contact points, whereby the contact points are welded breaking a path.

As a method of detecting a fault such as welding of the grid interconnection switch as described above, it may be assumed, apart from detection of the grid voltage for detecting a power failure or the like, for example, to detect a voltage between the inverter and the grid interconnection switch and, based on comparisons of effective values, integrated values and frequencies of the detected voltages, to detect a fault of the grid interconnection switch.

In this case, however, there is a concern that another voltage detection circuit as well as an arithmetic circuit for the effective values, the integrated values and the frequencies of the detected voltages are required, leading to a complicated configuration.

Accordingly, in view of the above mater, the present invention is to provide a grid-connected inverter apparatus having a simple configuration capable of reliably detecting a fault in the grid interconnection switch and a method of controlling the grid-connected inverter apparatus.

In order to achieve the above matter, a grid-connected inverter apparatus according to an aspect of the present invention includes:

an inverter configured to convert a DC output based on power generated from a power generation equipment into an AC;

a DC voltage measuring unit configured to measure a DC voltage on a DC input side of the inverter;

a grid interconnection switch having two independent relay switches each corresponding to phases of a grid power system to which the inverter is connected; and a control unit configured to control the two relay switches, such that the control unit, after opening the two relay switches, carries out changing control to one of the relay switches such that the opening control is changes to closing control and, based on a change in the DC voltage measured by the DC voltage measuring unit before and after the changing control, determines whether the other relay switch is faulty.

Another aspect of the present invention is the grid-connected inverter apparatus, such that the inverter is provided with a plurality of semiconductor switching elements and a plurality of freewheeling diodes each connected in parallel with the semiconductor switching elements, and the control unit, while controlling the plurality of semiconductor switching elements of the inverter to be non-conductive, determines whether the other relay switch is faulty.

Yet another aspect of the present invention is the grid-connected inverter apparatus, such that the inverter is provided with a plurality of semiconductor switching elements and a plurality of freewheeling diodes each connected in parallel with the semiconductor switching elements, and the control unit, while controlling the plurality of semiconductor switching elements of the inverter to increase an AC voltage of a grid power system and convert into a DC voltage, determines whether the other relay switch is faulty.

Yet another aspect of the present invention is the grid-connected inverter apparatus, such that the control unit, after determining whether the other relay switch is faulty, carries out changing control to the other relay switch from the opening control to the closing control while carrying out the opening control to the one of the relay switches and, based on a change in the DC voltage measured by the DC voltage measuring unit before and after the changing control, determines whether the one of the relay switches is faulty.

Yet another aspect of the present invention is the grid-connected inverter apparatus, such that the control unit, at the time of the opening control to the two relay switches, when a state of the DC voltage measured by the DC voltage measuring unit differs before and after the opening control to the two relay switches, carries out the changing control to the one of the relay switches.

Yet another aspect of the present invention is the grid-connected inverter apparatus, such that the control unit, at the time of the opening control to the two relay switches, when the state of the DC voltage measured by the DC voltage measuring unit does not differ before and after the opening control to the two relay switches, determines that the two relay switches are faulty.

Yet another aspect of the present invention is the grid-connected inverter apparatus, further including a link capacitor connected to an input side of the inverter, such that the DC voltage measuring unit measures a terminal voltage of the link capacitor.

Yet another aspect of the present invention is the grid-connected inverter apparatus, such that a converter configured to convert an output voltage is provided between the power generation equipment and the input side of the inverter, and the link capacitor is connected to a final stage of the converter.

Yet another aspect of the present invention is the grid-connected inverter apparatus, such that the power generation equipment includes a solar energy generation equipment, and the converter is used for MPPT control of the solar energy generation equipment.

Further, in order to achieve the above matter, a method of controlling a grid-connected inverter apparatus, according to yet another aspect, including an inverter configured to convert a DC output based on power generated from a power generation equipment into an AC, a DC voltage measuring unit configured to measure a DC voltage on a DC input side of the inverter, and a grid interconnection switch having two independent relay switches each corresponding to phases of a grid power system to which the inverter is connected, includes steps of:

carrying out, after opening control to the two relay switches, changing control to one of the relay switches from the opening control to closing control; and determining, based on a change in the DC voltage measured by the DC voltage measuring unit before and after the changing control to the one of the relay switches, whether the other relay switch is faulty.

According to the present invention, a fault of the grid interconnection switch may be reliably detected with a simple configuration.

DESCRIPTION OF EMBODIMENTS

Hereinafter, embodiments of the present invention will be described with reference to the accompanying drawings.

First Embodiment

Figure 1:
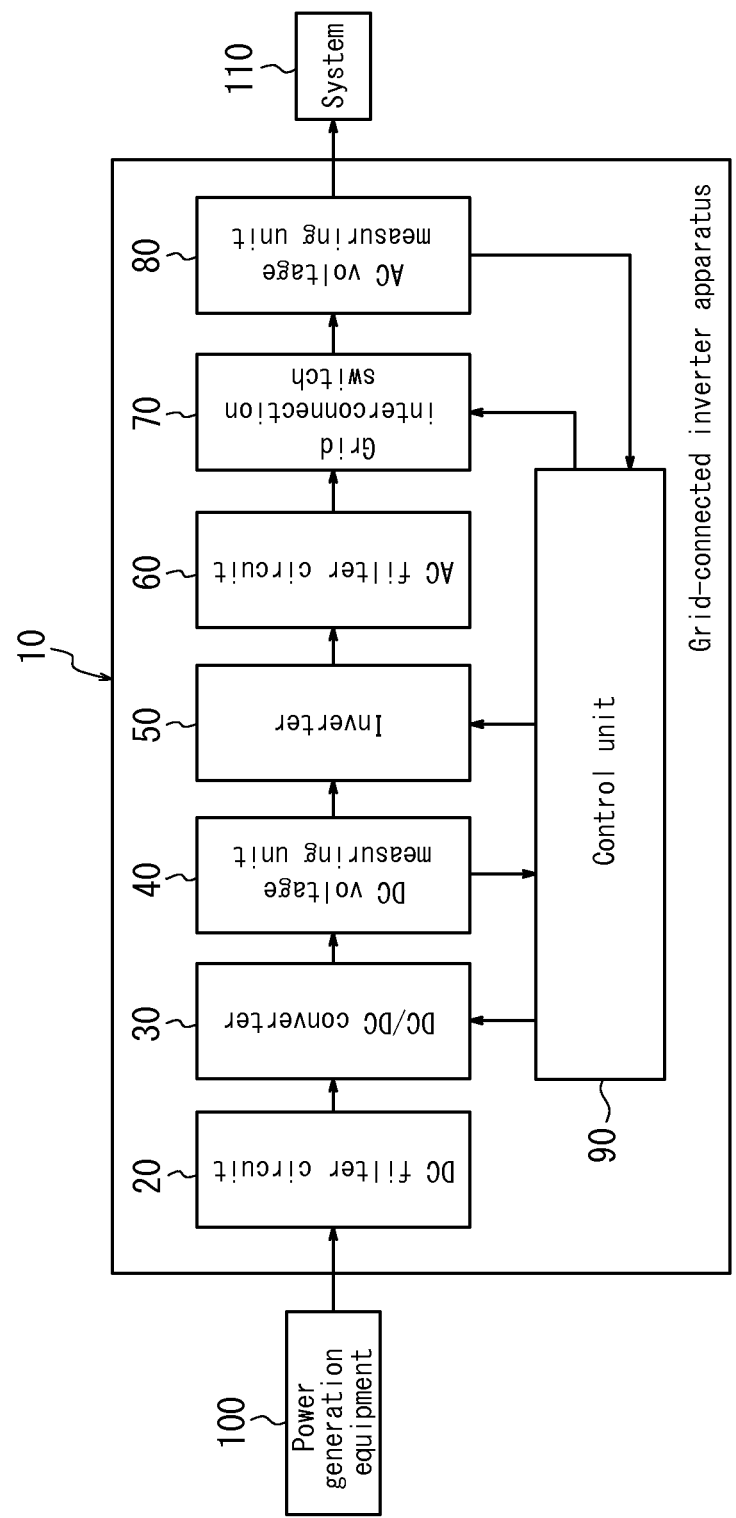
FIG. 1 is a block diagram illustrating a schematic configuration of a grid-connected inverter apparatus according to an embodiment.

FIG. 1 is a block diagram illustrating a schematic configuration of a grid-connected inverter apparatus according to a first embodiment of the present invention. A grid-connected inverter apparatus 10 includes a DC filter circuit 20, a DC/DC converter 30, a DC voltage measuring unit 40, an inverter 50, an AC filter circuit 60, a grid interconnection switch 70, an AC voltage measuring unit 80 and a control unit 90.

To the DC filter circuit 20, a DC output from a power generation equipment 100 such as a solar panel, a wind turbine generator, a fuel cell, a private power generator, or the like is input. The DC filter circuit 20 removes radiated noise and the like from the DC output from the power generation equipment 100. An output from the DC filter circuit 20 is supplied to the DC/DC converter 30.

The DC/DC converter 30 converts an input DC voltage into a predetermined DC voltage and supplies the predetermined DC voltage to the inverter 50. The inverter 50 converts an input DC voltage into an AC voltage at a predetermined frequency and supplies the AC voltage to the AC filter circuit 60. The AC filter circuit 60 removes high frequency noise and the like from the input AC voltage. An AC voltage output from the AC filter circuit 60 is output to a side of a grid power system (grid) 110 via the grid interconnection switch 70.

The DC voltage measuring unit 40 measures the DC voltage between the DC/DC converter 30 and the inverter 50 and inputs a result of the measurement to the control unit 90. Also, the AC voltage measuring unit 80 measures the AC voltage between the grid interconnection switch 70 and the grid 110 and inputs a result of the measurement to the control unit 90.

The control unit 90, based on the DC voltage measured by the DC voltage measuring unit 40 and the AC voltage measured by the AC voltage measuring unit 80, controls overall operations of the grid-connected inverter apparatus 10 such as controls of the DC/DC converter 30, the inverter 50, the grid interconnection switch 70, and the like. For example, when the power generation equipment 100 is the solar panel and the DC/DC converter 30 has an MPPT (Maximum Power Point Tracking) function, the control unit 90 controls the DC/DC converter 30 and the like so as to obtain maximum power from the power generation equipment 100. Thereby, using the power generation equipment 100 as a power source, an AC load (not shown) connected to the grid power system (grid) 110 is operated, and excess power flows to the grid 110 in an inverse flow manner.

Also, the control unit 90, based on the AC voltage measured by the AC voltage measuring unit 80 and the like, controls to break (open) the grid interconnection switch 70 upon occurrence of a failure such as a power failure of the grid 110, upon occurrence of a fault of the grid-connected inverter apparatus 10 itself, and upon a stopping operation by a user, as well as controlling to stop an operation of the DC/DC converter 30 and a DC converting operation of the inverter 50, as necessary.

Figure 2:
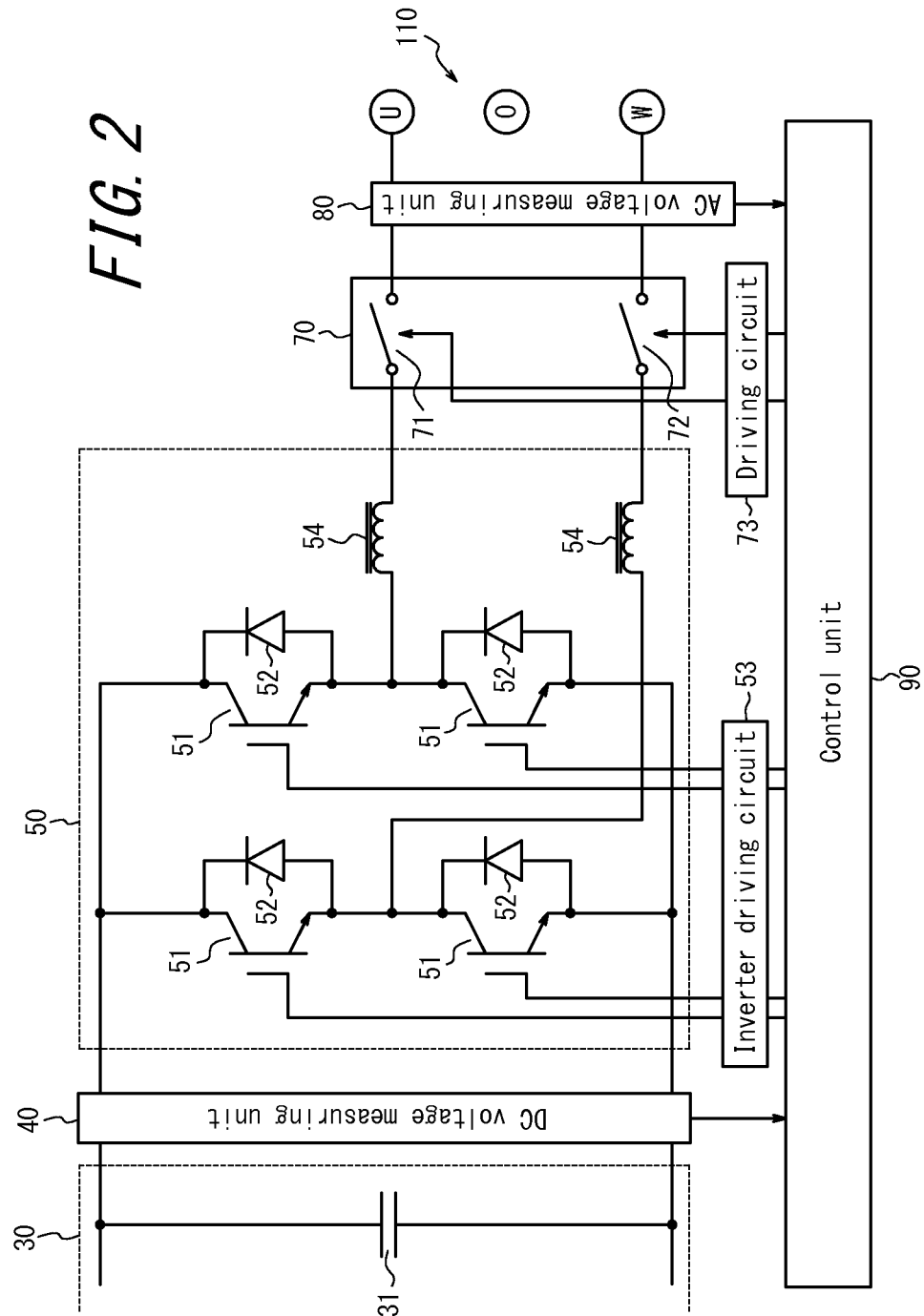
FIG. 2 is a diagram illustrating a configuration of a section of the grid-connected inverter apparatus in FIG. 1.

FIG. 2 illustrates a configuration of a section of the grid-connected inverter apparatus in FIG. 1. The DC/DC converter 30 has a link capacitor 31 connected to an output stage thereof, and a terminal voltage of the link capacitor 31 is measured by the DC voltage measuring unit 40. The inverter 50 is configured by using a known single-phase inverter circuit that includes four semiconductor switching elements 51 forming a full bridge circuit, a freewheel diodes 52 each connected in parallel with the semiconductor switching elements 51, and reactors 54 each inserted into phases of the single phase. Note that FIG. 2 illustrates a case where each semiconductor switching element 51 is configured by using an insulated gate bipolar transistor (IGBT), and a gate pulse supplied to a gate electrode thereof is subjected to PWM control by the control unit 90 via an inverter diving circuit 53. Also, the AC filter circuit 60 in FIG. 1 is omitted in FIG. 2.

According to the present embodiment, the grid interconnection switch 70 includes relay switches 71, 72 that are independent on each phase. The relay switch 71 is connected to, for example, a U-phase (a first phase) of the grid 110, and the relay switch 72 is connected to, for example, a W-phase (a second phase) of the grid 110. The relay switches 71, 72 are controlled to separately open or close by the control unit 90 via a driving circuit 73.

The following is a description of an operation of a fault diagnosis conducted to the grid interconnection switch 70.

According to the present embodiment, while the opening control of the grid interconnection switch 70 and, as necessary, a stopping operation of the operation of the DC/DC converter 30 and an AC conversion operation of the inverter 50 are carried out, an operation of the fault diagnosis to the grid interconnection switch 70 commences. Here, the opening control of the grid interconnection switch 70 is control by the control unit 90 to open both of the relay switches 71, 72 (for example, simultaneously). Also, the stopping operation of the AC conversion operation of the inverter 50 is controlled by the control unit 90 blocking a gate electrode of the semiconductor switching element 51 of the inverter 50, that is, turning gate block ON to make each of the semiconductor switching elements 51 non-conductive (open). Thereby, if a disconnection failure of the relay switches 71, 72 occurs due to welding or the like, the grid-connected inverter apparatus 10 is prevented from outputting the AC to the side of the grid 110.

In fault diagnosis of the grid interconnection switch 70, first, the control unit 90 determines whether the DC voltage measured by the DC voltage measuring unit 40 exceeds a predetermined voltage Vref1 at a point of time when a predetermined time to has passed from the opening control of the grid interconnection switch 70 as described above.

When the measured DC voltage exceeds the predetermined voltage Vref1 as a result, the control unit 90 determines that both of the relay switches 71, 72 are faulty. Here, needless to say, the DC voltage measured by the DC voltage measuring unit 40 exceeds the predetermined voltage Vref1 before the opening control of the grid interconnection switch 70 (both of the relay switches 71, 72). That is, when the measured DC voltage exceeds the predetermined voltage Vref1 before and after the opening control of the grid interconnection switch 70 (both of the relay switches 71, 72), the control unit 90 determines that both of the relay switches 71, 72 are faulty.

On the other hand, when the measured DC voltage is equal to or below the predetermined voltage Vref1, the control unit 90 further controls to closes (breaks) the relay switch 71 alone. Then, at a point of time when a predetermined time tb has passed from the closing control to the relay switch 71, the control unit 90 determines whether the DC voltage measured by the DC voltage measuring unit 40 exceeds the predetermined voltage Vref1.

In other words, the control unit 90, when the DC voltage measured by the DC voltage measuring unit 40 is maintained exceeding the predetermined voltage Vref1 before and after the opening control of the grid interconnection switch 70 (both of the relay switches 71, 72), determines that both of the relay switches 71 72 are faulty. When the measured DC voltage exceeding the predetermined voltage Vref1 changes to be equal to or below the predetermined voltage Vref1, the control unit 90 determines that neither of the relay switches 71, 72 is faulty.

Then, when the measured DC voltage is equal to or below the predetermined voltage Vref1, the control unit 90 determines that the relay switch 72 is normal. Or, when the DC voltage exceeds the predetermined voltage Vref1, the control unit 90 determines that the relay switch 72 is faulty.

Figure 3:
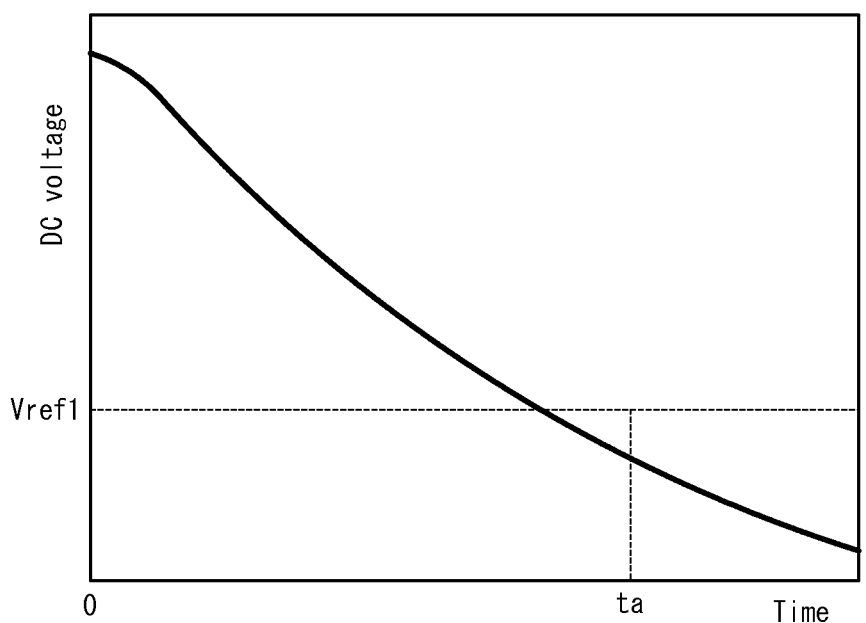
FIG. 3 is a diagram illustrating a change in a terminal voltage of a link capacitor in FIG. 2.

Here, when both of the relay switches 71, 72 are normal, the DC voltage measured by the DC voltage measuring unit 40, i.e., the terminal voltage of the link capacitor 31, at a point of time when the predetermined time ta has passed after disconnection (t=0) by the opening control of the grid interconnection switch 70, decreases to be equal to or below the predetermined voltage Vref1 as illustrated in FIG. 3 due to power consumption by an internal circuitry. Accordingly, regardless of the closing control to the relay switch 71 alone carried out thereafter, the DC voltage measured by the DC voltage measuring unit 40 stays equal to or below the predetermined voltage Vref1.

On the other hand, when the relay switch 72 alone remains in a closed state due to welding or the like, the AC voltage of the grid 110 is applied to the inverter 50 and full-wave rectification is performed by the freewheel diode 52. Thereby, the link capacitor 31 is charged, and the DC voltage measured by the DC voltage measuring unit 40 increases.

Here, the predetermined voltage Vref1 is set to be sufficiently lower than a minimum charging voltage of the link capacitor 31 by the DC/DC converter 30 or the inverter 50. Also, the predetermined time ta is set to a time (a few seconds) that is required for the terminal voltage of the link capacitor 31 to fall from, for example, a maximum charging voltage to equal to or below the predetermined voltage Vref1. Further, the predetermined time tb is set to a maximum time (a few seconds) that is required for the voltage of the link capacitor 31 charged by the DC/DC converter 30 or the inverter 50 to reach the predetermine voltage Vref1 from, for example, 0 volt.

Accordingly, as described above, at the point of time when the predetermined time ta has passed from the point of time when the opening control of the grid interconnection switch 70 is carried out and, also, the operation of the DC/DC converter 30 is stopped such that the gate block of the inverter 50 is turned on, when the DC voltage measured by the DC voltage measuring unit 40 exceeds the predetermined voltage Vref1, the control unit 90 determines that both of the relay switches 71, 72 are faulty. Also, in a case where the DC voltage measured by the DC voltage measuring unit 40 is equal to or below the predetermined voltage Vref1 at the point of time when the predetermined time ta has passed and then exceeds the predetermined voltage Vref1 at the point of time when the predetermined time tb has passed from the closing control to the relay switch 71 alone, the control unit 90 determines that the relay switch 72 is faulty.

Subsequently, the control unit 90 determines whether the relay switch 71 is faulty, in a similar manner. To that end, the control unit 90 carries out the opening control of the relay switch 71 and, after the predetermined time ta has passed from the opening control, carries out the closing control to the relay switch 72. Then, at the point of time when the predetermined time tb has passed from the closing control to the relay switch 72, the control unit 90 determines whether the DC voltage measured by the DC voltage measuring unit 40 exceeds the predetermined voltage Vref1.

When the measured DC voltage is equal to or below the predetermined voltage Vref1 as a result, the control unit 90 determines that the relay switch 71 is normal. On the other hand, when the measured DC voltage exceeds the predetermined voltage Vref1, it is assumed that the relay switch 71 remains in a closed state due to welding or the like, and thus the control unit 90 determines that the relay switch 71 is faulty.

The control unit 90 notifies the user of the results of determinations about the relay switches 71, 72 described above in a manner recognizable by the user, by using an appropriate notification means such as an alarm, a display or the like.

According to the present embodiment, as described above, by using the DC voltage measured by the DC voltage measuring unit 40, which is fundamentally necessary for controls of the DC/DC converter 30 and the inverter 50, and separately controlling the relay switches 71, 72 of each phase of the grid interconnection switch 70, the fault diagnoses of the relay switches 71, 72 are conducted. Accordingly, without the necessity of a separate voltage detection circuitry for detecting a voltage between the inverter 50 and the grid interconnection switch 70 or an arithmetic circuitry for an effect value, an integral value and a frequency of the detected voltage, a fault of the grid interconnection switch 70 may be reliably detected with a simple configuration.

Second Embodiment

Figure 4:
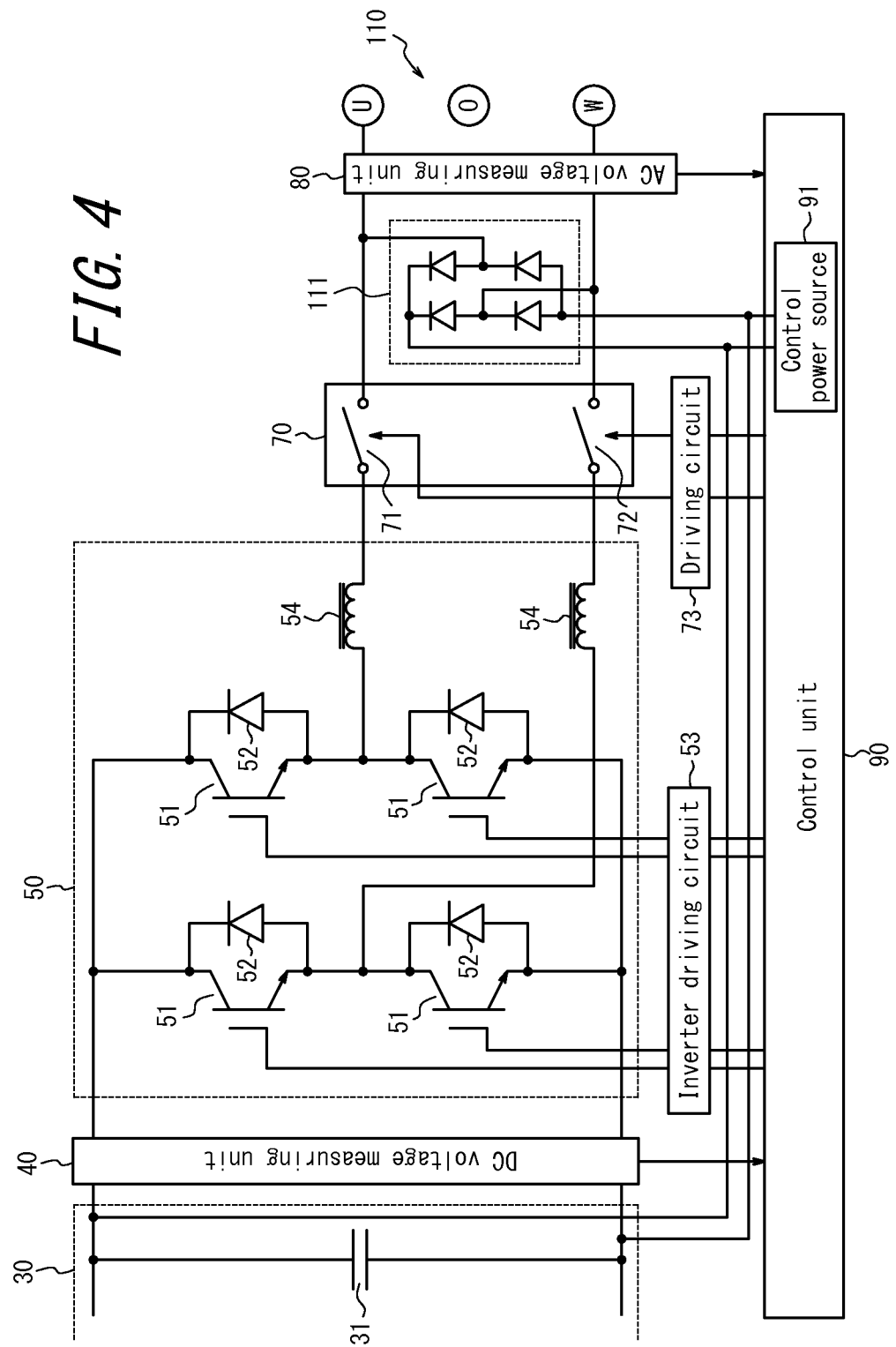
FIG. 4 is a diagram illustrating a configuration of a section of a grid-connected inverter apparatus according to another embodiment.

FIG. 4 illustrates a configuration of a section of a grid-connected inverter apparatus according to a second embodiment of the present invention. According to the present embodiment, in the configuration illustrated in FIG. 2, a rectifier unit 111 is connected to the grid 110, and a rectifying output terminal of the rectifier unit 111 and a terminal of the link capacitor 31 of the DC/DC converter 30 are connected in parallel with a control power source 91 of the control unit 90, so as to use a higher one of the rectifying output voltage of the rectifier unit 111 and the terminal voltage of the link capacitor 31 as a voltage source of the control power source 91.

Figure 5:
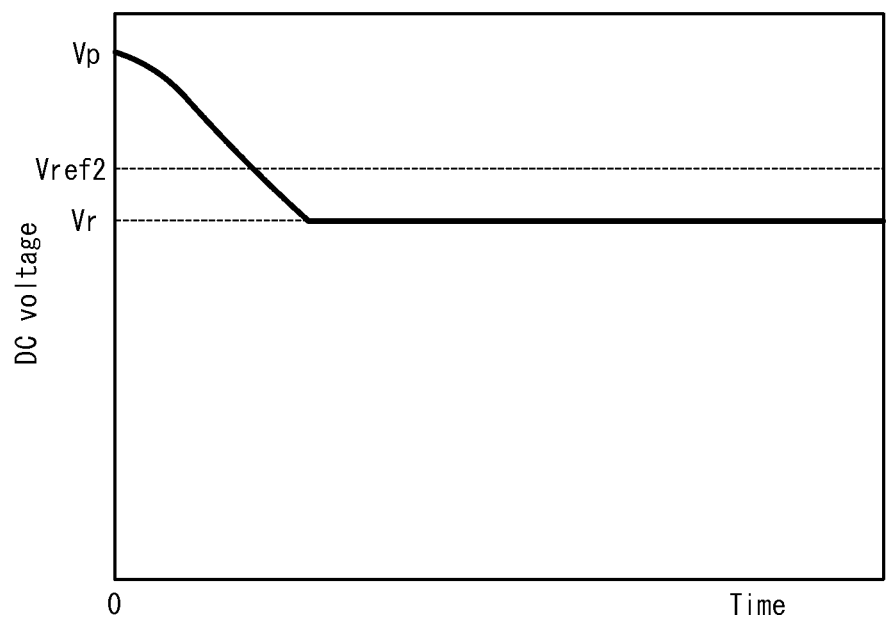
FIG. 5 is a diagram illustrating a change in a terminal voltage of a link capacitor in FIG. 4.

In such a configuration, when the control unit 90 carries out the opening control to both of the relay switches 71, 72 of the grid interconnection switch 70 and also carries out the stopping operation of the operation of the DC/DC converter 30 and the AC converting operation of the inverter 50, the DC voltage measured by the DC voltage measuring unit 40 follows the line illustrated in FIG. 5. That is, unless the grid 110 has a power failure, the DC voltage measured by the DC voltage measuring unit 40 is maintained at a rectified voltage Vr of a grid voltage by the rectifier unit 111.

As such, according to the present embodiment, when the control unit 90 carries out (for example, simultaneously) the opening control to the relay switches 71, 72 of the grid interconnection switch 70 and conducts the fault diagnosis to the grid interconnection switch 70, the control unit 90 controls the inverter 50 to increase the grid voltage of the grid 110 and convert into the DC. Then, the control unit 90 determines whether the DC voltage measured by the DC voltage measuring unit 40 exceeds a predetermined voltage Vef2. Here, the predetermined voltage Vref2, as illustrated in FIG. 5, is set at an appropriate voltage that is higher than the rectified voltage Vr and below an increased voltage Vp by the inverter 50.

When the measured DC voltage exceeds the predetermined voltage Vref2 as a result, the control unit 90 determines that both of the relay switches 71, 72 are faulty. Here, needless to say, the DC voltage measured by the DC voltage measuring unit 40 exceeds the predetermined voltage Vref2 before the opening control to both of the relay switches 71, 72. That is, when the measured DC voltage exceeds the predetermined voltage Vref2 before and after the opening control to both of the relay switches 71, 72, the control unit 90 determines that both of the relay switches 71, 72 are faulty. On the other hand, when the measured DC voltage is equal to or below the predetermined voltage Vref2, the control unit 90 further carries out the closing control to the relay switch 71 alone and determines whether the DC voltage measured by the DC voltage measuring unit 40 exceeds the predetermined voltage Vref2.

When the measured DC voltage is equal to or below the predetermined voltage Vref2 as a result, the control unit 90 determines that the relay switch 72 is normal. On the other hand, when the measured DC voltage exceeds the predetermined voltage Vref2, it is assumed that the relay switch 72 is closed due to welding or the like, and thus the control unit 90 determines that the relay switch 72 is faulty.

In other words, the control unit 90, when the DC voltage measured by the DC voltage measuring unit 40 is maintained exceeding the predetermined voltage Vref2 before and after the opening control to the grid interconnection switch 70 (both of the relay switches 71, 72), determines that both of the relay switches 71, 72 are faulty. When the DC voltage exceeding the predetermined voltage Vref2 decreases to be equal to or below the predetermined voltage Vref2, the control unit 90 determines that neither of the relay switches 71, 72 is faulty.

Subsequently, the control unit 90 conducts the fault diagnosis to the relay switch 71, in a similar manner. To that end, the control unit 90 carries out the opening control to the relay switch 71 and also the closing control to the relay switch 72. Then, the control unit 90 determines whether the DC voltage measured by the DC voltage measuring unit 40 exceeds the predetermined voltage Vref2.

When the measured DC voltage is equal to or below the predetermined voltage Vref2 as a result, the control unit 90 determines that the relay switch 71 is normal. On the other hand, when the measured DC voltage exceeds the predetermined voltage Vref2, it is assumed that the relay switch 71 is closed due to welding or the like, and thus the control unit 90 determines that the relay switch 71 is faulty.

According to the present embodiment, as described above, in using the output voltage of the DC/DC converter 30 and the rectified voltage of the grid 110 as the control power source 91 of the control unit 90, when the fault diagnoses of the relay switches 71, 72 are conducted, the inverter 50 is controlled to increase the grid voltage to the DC voltage. Then, by separately controlling the relay switches 71, 72 of each phase of the grid interconnection switch 70, the fault diagnoses to the relay switches 71, 72 are conducted. Accordingly, in a manner similar to the first embodiment, without the necessity of the separate voltage detection circuitry for detecting the voltage between the inverter 50 and the grid interconnection switch 70 or the arithmetic circuitry for the effect value, the integral value and the frequency of the detected voltage, a fault of the grid interconnection switch 70 may be reliably detected with a simple configuration.

Note that the present invention is not limited to the above embodiments but various modifications may be made without departing from the spirit of the invention. For example, in each of the above embodiments, when the fault diagnosis to each of the relay switches 71, 72 is conducted, the fault diagnosis to the relay switch 72 is conducted first and then the fault diagnosis to the relay switch 71 is conducted. However, this order may be reversed. Further, in the above embodiments, when neither of the relay switches 71, 72 is determined as faulty first, the fault diagnosis is then separately conducted to each of the relay switches 71, 72. However, when one of the relay switches 71, 72 is diagnosed as faulty, both of the relay switches 71, 72 are replaced, typically. Accordingly, at a point of time when one of the relay switches 71, 72 is diagnosed as faulty, the diagnosis may be ended.

REFERENCE SIGNS LIST 10 grid-connected inverter apparatus
20 DC filter circuit
30 DC/DC converter
31 link capacitor
40 DC voltage measuring unit
50 inverter
51 semiconductor switching element
52 freewheel diode 53 inverter driving circuit
54 reactor
60 AC filter circuit
70 grid interconnection switch
71, 72 relay switch
73 driving circuit
80 AC voltage measuring unit
90 control unit
91 control power source
100 power generation equipment
110 grid power system (grid)
111 rectifier unit

The invention claimed is:

1. A grid-connected inverter apparatus comprising:
an inverter configured to convert a DC output based on power generated from a power generation equipment into an AC;
a DC voltage measuring unit configured to measure a DC voltage on a DC input side of the inverter;
a grid interconnection switch having two independent relay switches each corresponding to phases of a grid power system to which the inverter is connected; and
a control unit configured to control the two relay switches, wherein
the control unit, after opening the two relay switches, carries out changing control to one of the relay switches such that the opening control is changes to closing control and, based on a change in the DC voltage measured by the DC voltage measuring unit before and after the changing control, determines whether the other relay switch is faulty.

2. The grid-connected inverter apparatus according to claim 1, wherein
the inverter is provided with a plurality of semiconductor switching elements and a plurality of freewheeling diodes each connected in parallel with the semiconductor switching elements, and
the control unit, while controlling the plurality of semiconductor switching elements of the inverter to be non-conductive, determines whether the other relay switch is faulty.

3. The grid-connected inverter apparatus according to claim 1, wherein
the inverter is provided with a plurality of semiconductor switching elements and a plurality of freewheeling diodes each connected in parallel with the semiconductor switching elements, and
the control unit, while controlling the plurality of semiconductor switching elements of the inverter to increase an AC voltage of a grid power system and convert into a DC voltage, determines whether the other relay switch is faulty.

4. The grid-connected inverter apparatus according to claim 1, wherein
the control unit, after determining whether the other relay switch is faulty, carries out changing control to the other relay switch from the opening control to the closing control while carrying out the opening control to the one of the relay switches and, based on a change in the DC voltage measured by the DC voltage measuring unit before and after the changing control, determines whether the one of the relay switches is faulty.

5. The grid-connected inverter apparatus according to claim 1, wherein
the control unit, at the time of the opening control to the two relay switches, when a state of the DC voltage measured by the DC voltage measuring unit differs before and after the opening control to the two relay switches, carries out the changing control to the one of the relay switches.

6. The grid-connected inverter apparatus according to claim 5, wherein
the control unit, at the time of the opening control to the two relay switches, when the state of the DC voltage measured by the DC voltage measuring unit does not differ before and after the opening control to the two relay switches, determines that the two relay switches are faulty.

7. The grid-connected inverter apparatus according to claim 1, further comprising a link capacitor connected to an input side of the inverter, wherein
the DC voltage measuring unit measures a terminal voltage of the link capacitor.

8. The grid-connected inverter apparatus according to claim 7, wherein
a converter configured to convert an output voltage is provided between the power generation equipment and the input side of the inverter, and
the link capacitor is connected to a final stage of the converter.

9. The grid-connected inverter apparatus according to claim 8, wherein
the power generation equipment includes a solar energy generation equipment, and
the converter is used for MPPT control of the solar energy generation equipment.

10. A method of controlling a grid-connected inverter apparatus which includes an inverter configured to convert a DC output based on power generated from a power generation equipment into an AC, a DC voltage measuring unit configured to measure a DC voltage on a DC input side of the inverter, and a grid interconnection switch having two independent relay switches each corresponding to phases of a grid power system to which the inverter is connected, the method comprising steps of:
carrying out, after opening control of the two relay switches, changing control to one of the relay switches from the opening control to closing control; and
determining, based on a change in the DC voltage measured by the DC voltage measuring unit before and after the changing control to the one of the relay switches, whether the other relay switch is faulty.

* * * * *